United States Patent
Liu et al.

[11] Patent Number: 5,875,152
[45] Date of Patent: Feb. 23, 1999

[54] ADDRESS TRANSITION DETECTION CIRCUIT FOR A SEMICONDUCTOR MEMORY CAPABLE OF DETECTING NARROWLY SPACED ADDRESS CHANGES

[75] Inventors: Yin-Shang Liu, Tsao-Twen; Kuen-Long Chang, Mucha Taipei; Chun-Hsiung Hung, Hsinchu; Weitong Chuang, Taichung, all of Taiwan; Ray-Lin Wan, Fremont, Calif.

[73] Assignee: Macronix International Co., Ltd., Hsinchu, Taiwan

[21] Appl. No.: 751,513

[22] Filed: Nov. 15, 1996

[51] Int. Cl.⁶ .............................. G11C 8/00; H03K 5/22
[52] U.S. Cl. ................ 365/233.5; 365/194; 365/189.08; 365/230.08; 327/22; 327/24
[58] Field of Search ................ 365/233.5, 194, 365/189.08, 230.08; 327/18, 20, 22, 24

[56] References Cited

U.S. PATENT DOCUMENTS

| | | | |
|---|---|---|---|
| 5,374,894 | 12/1994 | Fong | 327/14 |
| 5,383,155 | 1/1995 | Ta | 365/191 |
| 5,418,479 | 5/1995 | Sambandan | 326/93 |
| 5,475,320 | 12/1995 | Ko | 326/21 |
| 5,493,538 | 2/1996 | Bergman | 365/233.5 |
| 5,566,129 | 10/1996 | Nakashima et al. | 365/233.5 |

*Primary Examiner*—Viet Q. Nguyen
*Assistant Examiner*—Andrew Q. Tran
*Attorney, Agent, or Firm*—Wilson Sonsini; Goodrich & Rosati; Mark A. Haynes

[57] ABSTRACT

The present invention provides a new (ATD) address transition detection circuit for use on an address bus having any number of address lines. An ATD circuit is disclosed which comprises a first and second circuit and an interval timer. The first circuit has a first and second input and an output. The first circuit receives, at the first input, a change signal corresponding to transitions in one or more addresses of an address bus. In response, the output of the first circuit transitions from an initial first state to a second state. The first circuit is also responsive to a reset command at the second input to return the output to the first state. The interval timer has an output coupled to the second input of the first circuit and an input. The interval timer responsive to an initialize command at the input initiates a timed interval and after the timed interval generates the reset command at the output. The second circuit has an output coupled to the input of the interval timer and an input. The second circuit responsive to the change signal at the input generates an initialize command at the output. The circuit provides a second state at the output of the first circuit, for all including the last received in a series of change signals. This assures that all address transitions have been detected before a memory access is allowed.

19 Claims, 7 Drawing Sheets

ADDRESS TRANSITION DETECTION CIRCUIT FOR A SEMICONDUCTOR MEMORY CAPABLE OF DETECTING NARROWLY SPACED ADDRESS CHANGES

BACKGROUND OF THE INVENTION

1. Field of the Invention

The present invention relates to digital circuits and more particularly to (ATD) Address Transition Detection circuits.

2. Description of Related Art

ATD circuits are employed in memory devices to detect a change in any one of the address lines of memory. When a new address is supplied by the user to memory, that address is received by both a memory controller and by the row and column decoders for the memory array. As the address transition is detected by the memory device, a new address has been supplied by the user, and this address must be decoded by the decoding circuitry of the memory device in order to access the actual memory address. When a memory address is to be accessed, the data path to and from the memory address must be precharged in preparation for the transfer of this data. This precharging may involve charging a capacitor in a row and column to be addressed. Typically, a pulse from the ATD circuit is used in the memory to begin precharging this path.

A device for precharging a memory circuit in response to an ATD circuits is disclosed in U.S. Pat. No. 5,493,538, issued on Feb. 20, 1996, and entitled *Minimum Pulse Width Address Transition Detection Circuit,* which is herein incorporated by reference. This patent discloses a device for detecting a change of address and latching the change for a period of time sufficient to precharge a memory. The address changes are detected by an edge detect and output as a series of pulses to the set input of a latch. Provided the latch has been reset before a pulse is received, the output of the latch will transition to a set condition. The set condition initiates memory precharge. The set condition also initiates a delayed feedback to the reset input of the latch. Precharge continues until the latch is reset. The problem with this device, however, is that when pulses are spaced apart in time by an interval less than the maximum delay interval, the pulse immediately after a pulse that placed the latch output in a set condition, will not be operated on. The '538 device will not therefore precharge memory for a sufficient period of time. This can lead to the need to resend an address in order to properly precharge memory. It can also lead to incorrect data being written to or read from memory if the memory has not been adequately precharged. The shortcomings of the '538 device are compounded in memories having address buses with a large number of address lines. In this environment the occurrence of narrowly spaced address changes is relatively frequent and the inability of the '538 device to detect each pulse results in delayed or incorrect memory accesses.

In memory applications, the ATD pulse is also used to pre bias the sense amplifier, to boost the wordlines, or to precharge the output driver.

If the ATD does not detect each narrowly spaced address change, it may lead to delayed or incorrect memory accesses in the above application. For example, if two address transitions are narrowly spaced and only first address transitions are detected, the memory control circuit will not bias the sense amplifier to the optimized timing corresponding to the second address change since its address transition is not detected.

In the event the ATD circuit is used to boast or wordline, a specified time interval must exist between the final address transition and the boost of the wordlines. Otherwise, the wordlines may be boosted before the decoded wordlines have settled to their final state. This may cause the wrong set of wordlines to be boosted and can also lead to incorrect data being read from the memory. What is needed is an ATD circuit that will detect each address transition under all conditions.

SUMMARY OF THE INVENTION

A first object of the invention is to provide an ATD circuit which detects each address transitions.

A second object of the invention is to provide an ATD circuit suitable for use with memories having address buses with a large number of addresses.

A third object of the invention is to reduce the amount of space required to construct an ATD circuit.

The present invention provides a new ATD circuit for use on an address bus having any number of addresses.

In a first preferred embodiment, an ATD circuit is disclosed which comprises a first and second circuit and an interval timer. The circuit provides an extended second state at the output of the first circuit, for all including the last received in a series of change signals. The first circuit has a first and second input and an output. The first circuit receives, at the first input, a change signal corresponding to transitions in an address signal. In response, the output of the first circuit transitions from an initial first state to a second state. The first circuit is also responsive to a reset command at the second input to return the output to the first state. The interval timer has an output coupled to the second input of the first circuit and an input. The interval timer responsive to an initialize command at the input initiates a timed interval and after the timed interval generates the reset command at the output. The second circuit has an output coupled to the input of the interval timer and an input. The second circuit is responsive to the change signal at the input to generate an initialize command at the output. In an alternate embodiment, the second circuit is responsive to both the change signal and the output of the first circuit to generate an initialize command at the output.

In a second preferred embodiment, a compact circuit for use in address buses with a large number of address lines is disclosed. The novel features of this embodiment allow a single ATD circuit to respond to change signals received from the 'N' address of an address bus. A plurality of change signals corresponding to address changes in a respective address of an 'N' address bus are combined in an OR gate. The output of the OR gate is a combined change signal. The combined change signal is received at a first input of the first circuit. The combined change signal is processed by a first and second circuit and interval timer corresponding to that discussed above in connection with the first preferred embodiment.

In a third preferred embodiment an integrated circuit memory having a plurality of input pins and comprising an ATD unit is disclosed. The plurality of input pins are each connected to the input of a respective edge detect unit. The edge detect units respond to rising or falling edge of an address connected to a respective input pin and output a change signal. The output of all edge detect units is coupled to a respective input of an OR gate. The OR gate responds to change signals at its inputs to output a combined change signal. The combined change signal is received and processed by a first and second circuit and interval timer similar to that discussed above in connection with the first preferred embodiment. The output of the first circuit may be coupled to a memory controller, decoder, or buffer.

Other aspects and advantages of the present invention can be seen upon review of the figures, the detailed description and the claims which follow.

DETAILED DESCRIPTION

The present invention is an ATD circuit for use on a single address or a plurality of address lines, to detect address transitions. The ATD detects each address transition even under conditions of rapid address input change. The invention may advantageously be used in memories having address buses with a large number of addresses.

Figure 1:
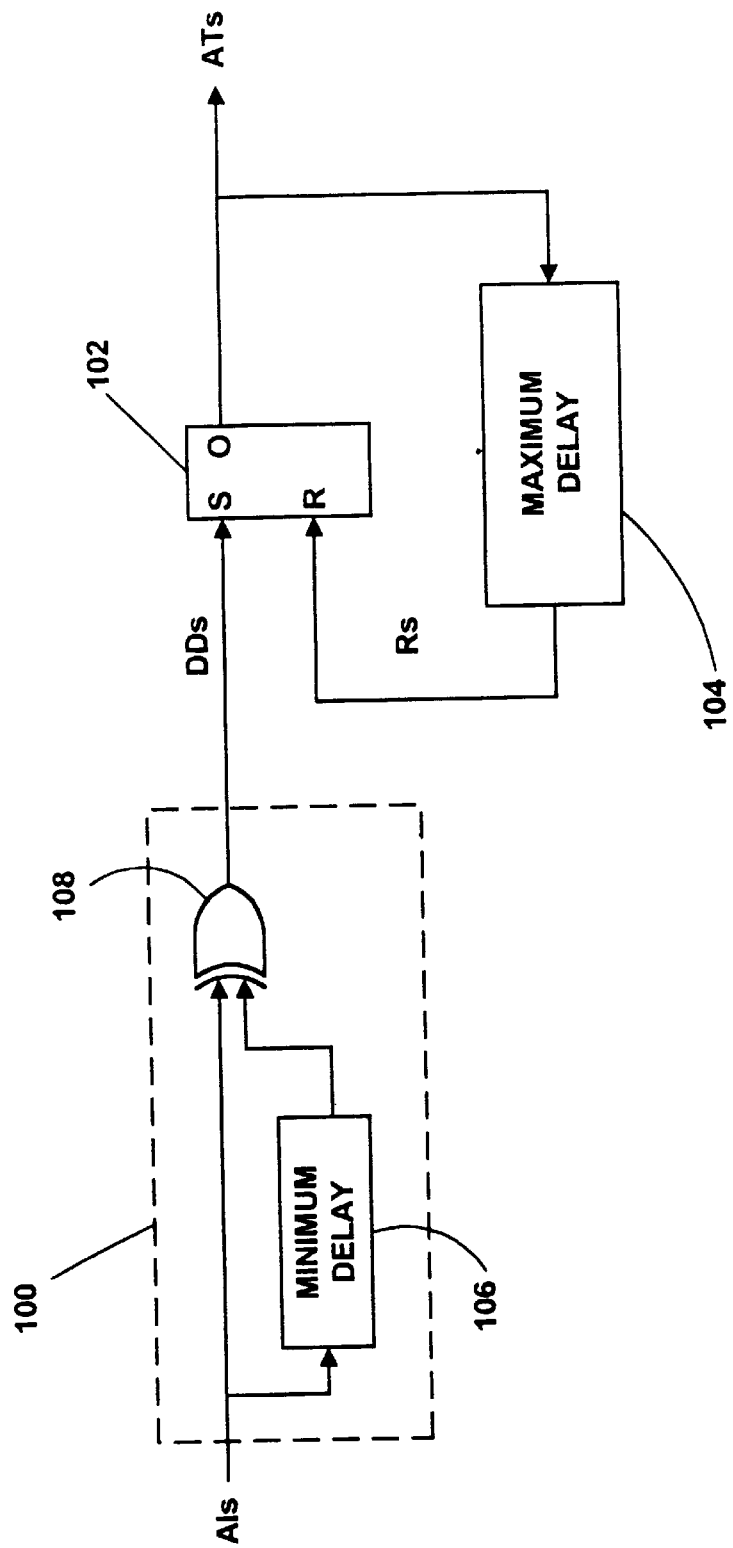
FIG. 1 is a Prior Art address transition detection unit.

FIG. 1 illustrates a Prior Art ATD circuit. The circuit consists of a edge detect unit 100, a first circuit 102 and maximum delay unit 104. Edge detect unit 100 consists of a minimum delay unit 106 and a difference detector 108. The minimum delay unit has an input coupled to an AIs (address input signal) and an output coupled to one of the two inputs of the difference detector. The other input of the difference detector is coupled directly to AIs. The difference detector detects a difference between the AIs and the delayed AIs by generating a DDs (Difference Detector signal) on its output. DDs comprises pulses corresponding to either one or both of a rising/falling edge in the address input signal. The difference signal is received by the first circuit 102. As disclosed in U.S. Pat. No. 5,493,538, the first circuit is an SR latch and the DDs is received at the first input of the latch, the set input. The output of the latch is the ATs (address transition signal). The ATs first and a second state, corresponding in the '538 patent, to a reset condition and a set condition. The set condition is associated with a memory precharge. The ATs is feed back to the input of maximum delay unit 104. When a transition in the ATs to a set condition is detected by the maximum delay unit, that signal is subject to a maximum delay interval. At the end of the maximum delay interval an Rs (Reset Signal) is output from maximum delay unit to a reset input of the latch. Upon receipt of the reset signal, the latch returns the ATs from a set condition to a reset condition, thereby disabling memory precharge.

As will be discussed in greater detail in FIG. 6, this Prior Art circuit, will not operate on any changes in AIs that occur at intervals spaced apart by less than the maximum delay interval. This failure to operate on address transitions narrowly separated in time is a shortcoming in the Prior Art circuits. This deficiency will impair memory accesses.

Figure 2:
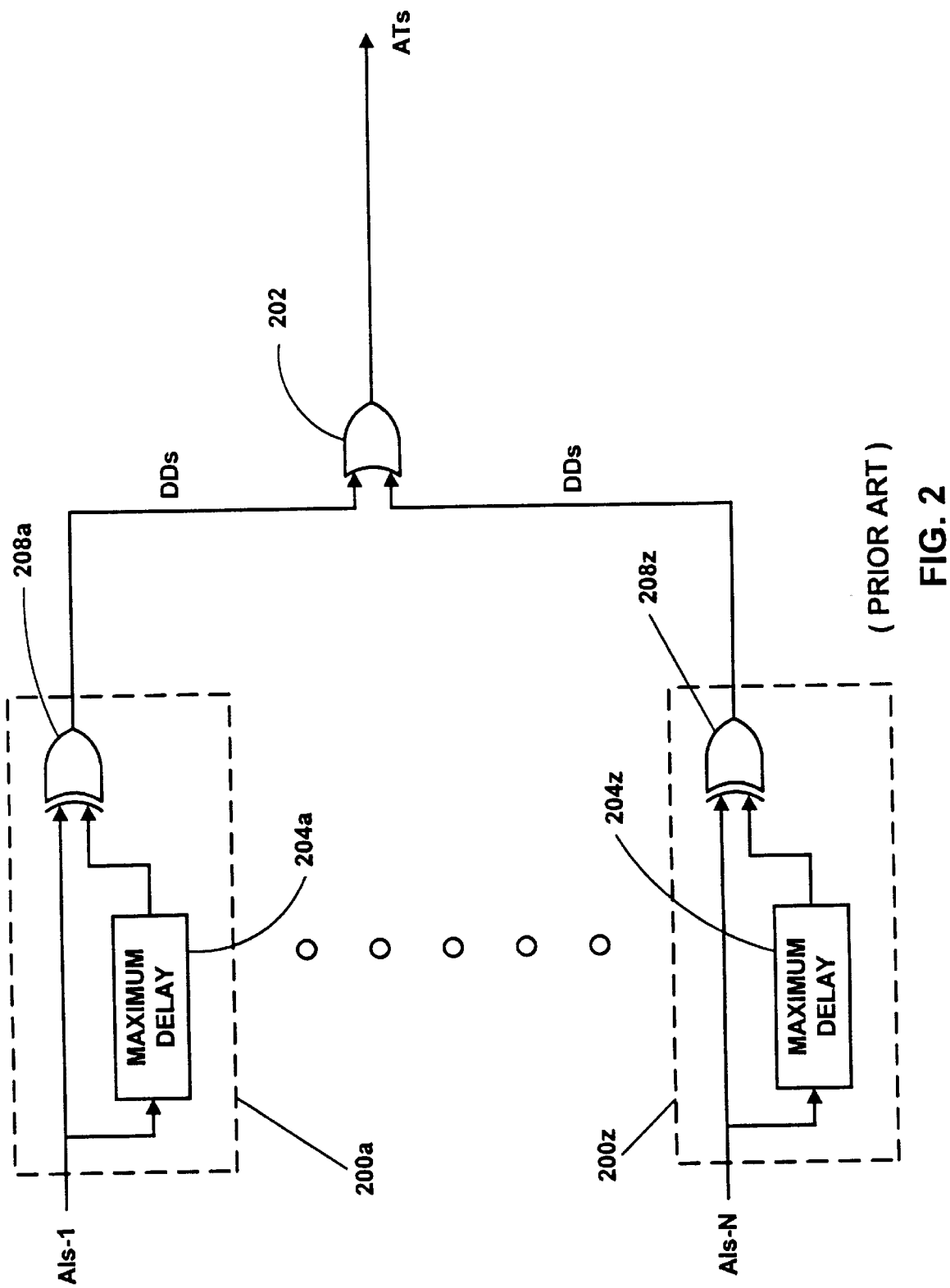
FIG. 2 is a Prior Art address transition detection circuit for an 'N' address bus.

FIG. 2 illustrates a Prior Art ATD circuit for an address bus having 'N' address lines. The circuit of FIG. 2 consists of a plurality of edge detect units, each dedicated to a specific address. The edge detect units 200A and 200Z are referenced. Edge detect unit 200A consists of maximum delay unit 204A and difference detector 208A. Edge detect unit 200Z consists of maximum delay unit 204Z and difference detector 208Z. The output of all edge detects 220A–Z is connected to each of the inputs of OR gate 202.

As illustrated in FIG. 2, an address referenced as AIs-1 serves as input to edge detect 200A and specifically to both maximum delay unit 204Z and to the first of two inputs of difference detector 208A. Maximum delay unit 204Z imposes a delay on the address signal and outputs the delayed signal to the second input of difference detector 208A. The difference detector 208A detects a difference between the original and delayed signal from bitline AIs-1, and outputs a DDs in the form of pulses corresponding to that difference. Edge detect 200Z is connected to AIs-N and consists of a maximum delay unit 204Z and a difference detector 208Z, which perform in the manner discussed above in connection with maximum delay unit 204Z and difference detector 208Z. The difference detector 208Z detects a difference between the original and delayed signal from bitline AIs-N and outputs a DDs in the form of pulses corresponding to that difference. The DDs from all edge detect units including the referenced units is combined in OR gate 202. The output of OR gate is the ATs.

The circuit is not compact. The circuit consumes a large amount of chip 'real estate' because it utilizes a maximum delay circuit for each of the addresses. The maximum delay circuit relies on capacitors to produce the maximum delay interval. Capacitors, particularly large capacitors, associated with maximum delay intervals, consume large amounts of chip 'real estate' when realized in an integrated circuit.

Figure 3:
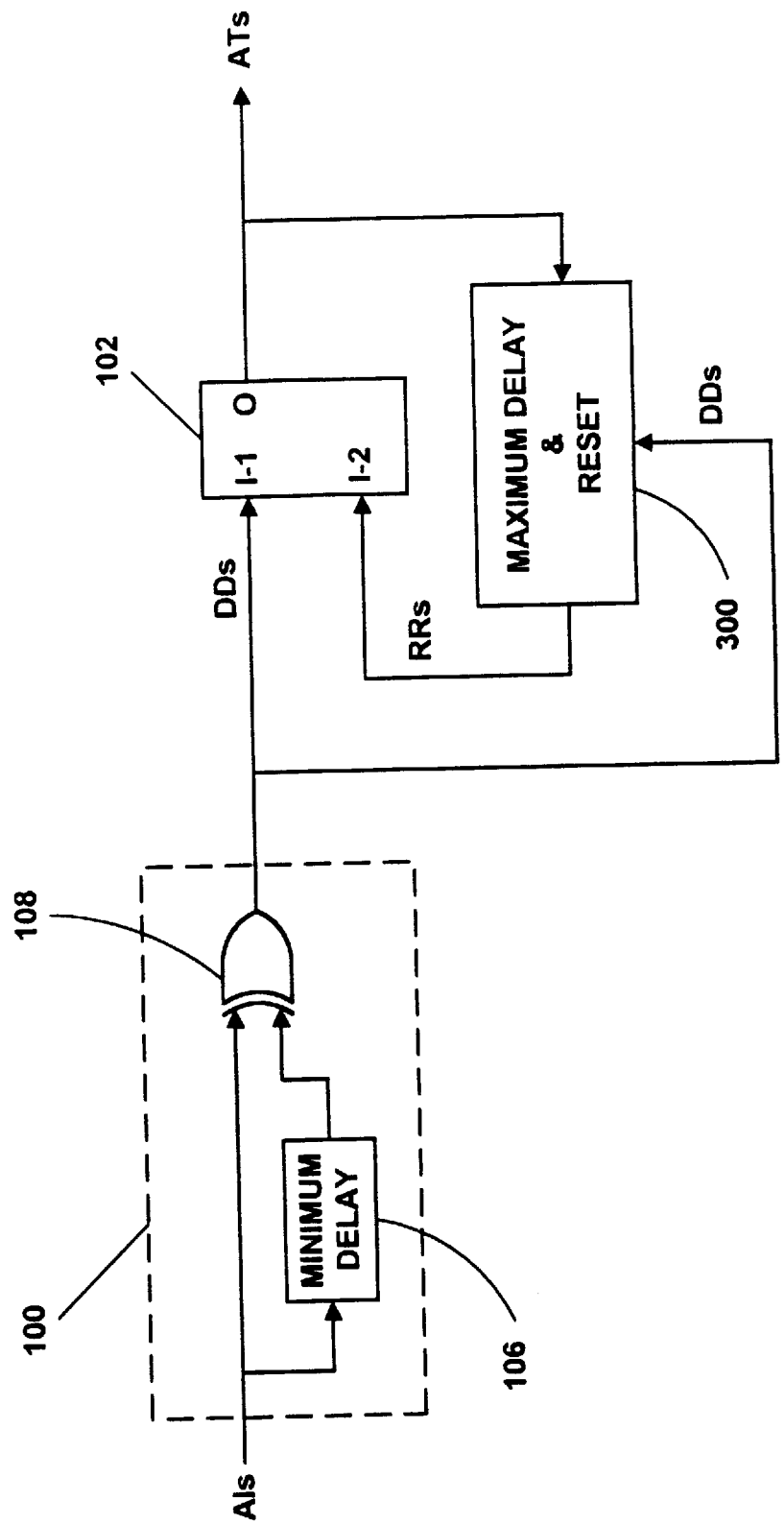
FIG. 3 is an address transition detection circuit for a single address.

FIG. 3 illustrates a preferred embodiment of an ATD circuit suitable for connection to a single address in accordance with the current invention. The circuit comprises an edge detect unit 100 with a first circuit 102 and a maximum resettable delay unit 300. Edge detect unit 100 comprises a minimum delay unit 106 and a difference detector 108. The minimum delay unit has an input coupled to an AIs and an output. The difference detector has two inputs and an output. One of the inputs is connected to the output of the minimum delay unit and the other is connected to the AIs. In the manner described and discussed above, minimum delay unit 106 outputs the AIs in delayed form to difference detector 108. Responsive to both the AIs and the delayed AIs on either of its inputs, the difference detector 108 outputs a DDs. The DDs may comprise positive or negative going pulses corresponding to changes in the AIs. Changes to which the pulses correspond may be either one or both of a rising/falling edge of the address input signal. Difference detector 108 may be realized in multiple forms including for example, an XNOR or XOR gate.

The DDs is received by both first circuit 102 and by resettable maximum delay unit 300. First circuit 102 has a first and a second input. The DDs is received at the first input. A reinitialized reset signal is received at the second input. In this embodiment the first circuit is a SR latch and the first input is a set input and the second input is a reset input. The SR latch has the properties set forth in the following tables.

TABLE 1

| S | R | Output = ATs Initial State | Output = ATs Final State |
|---|---|---|---|
| 1 | 1 | 0 | 0 |
| 1 | 1 | 1 | 0 |
| 1 | 0 | 0 | 1 |
| 1 | 0 | 1 | 1 |
| 0 | 1 | 0 | 0 |
| 0 | 1 | 1 | 0 |
| 0 | 0 | 0 | 0 |
| 0 | 0 | 1 | 1 |

The first circuit 102 may also be realized for example, as RS, JK, T, D latch, as a sample and hold circuit, and so forth . . .

The output of first circuit 102 is the ATs. The ATs is feedback to resettable maximum delay unit 300. The maximum resettable delay unit has a first and second input and an output. The first input is connected to the output of the first circuit 102 and the second input is connected to the output of the difference detector 108. This latter connection is lacking in the Prior Art. The output is connected to the second input of the first circuit 102. Maximum resettable delay unit receives at its first input the ATs and at its second input the DDs and responsive thereto generates, at its output, an RRs (reinitialized reset signal).

A difference between this circuit and the circuit in Prior Art FIG. 1 is that the DDs is feed forward to the maximum resettable delay unit 300. This feed forward feature allows all pulses to effect the maximum resettable delay unit. In the Prior Art circuit, only those pulses which produce a transition in the output of the first circuit from a first state to a second state effect the maximum resettable delay unit. For pulses spaced apart farther in time than the delay interval resettable maximum delay unit 300 will perform in a manner similar to that shown in Prior Art FIG. 1. However, for pulses separated in time by an interval less than the delay interval the circuit disclosed herein will perform substantially differently then that of the Prior Art. Specifically, due to the resettable feature, each pulse on the DDs causes the reinitialize delay logic to reinitialize the delay interval and thereby extend the second state, the set condition on the output of the first circuit. This assures that the next received pulse, in a string of pulses separated in time by an interval less than the timed interval of the resettable maximum delay unit, will not be ignored and will result in a delay period sufficient to recharge memory.

Figure 4:
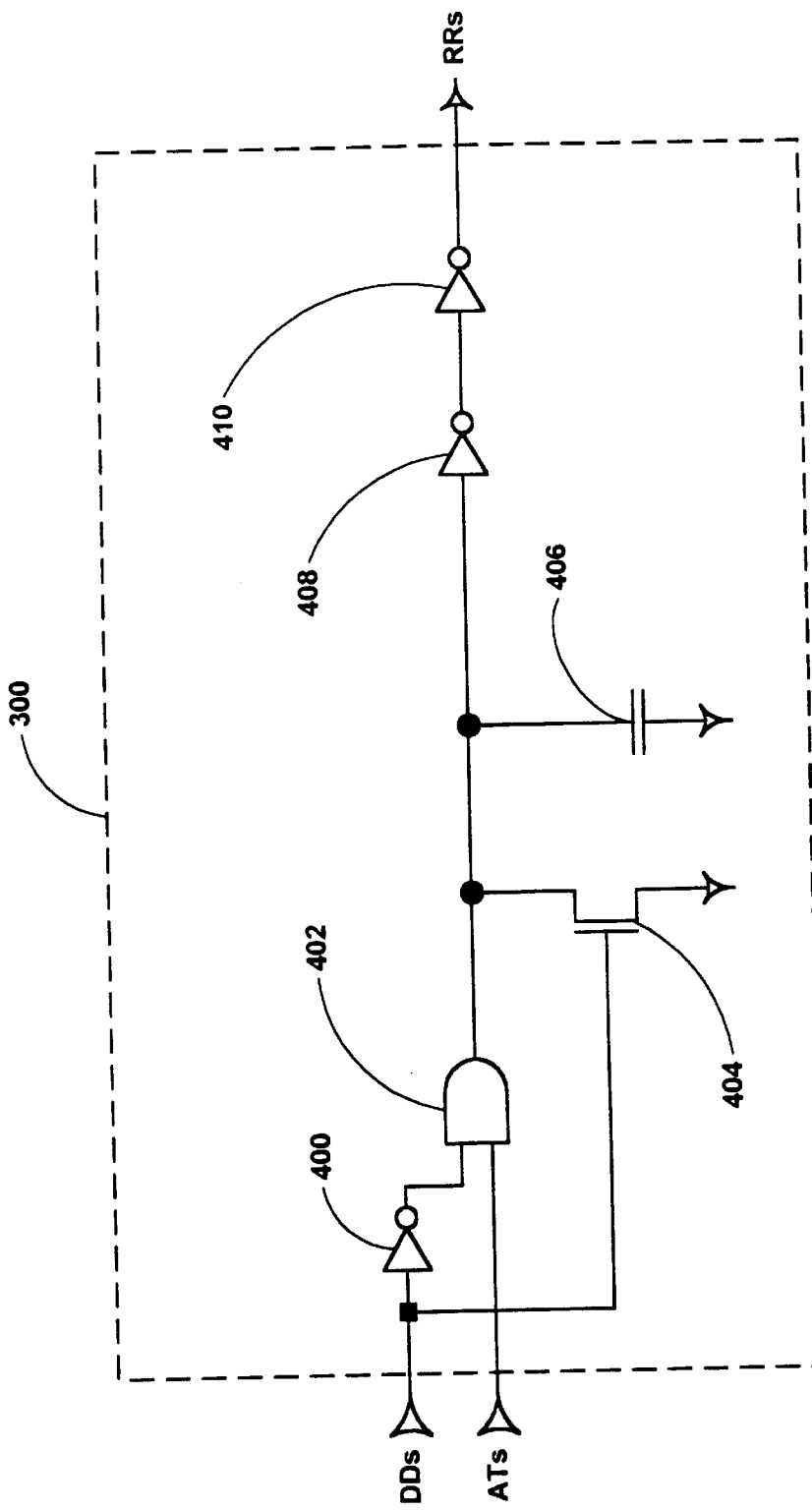
FIG. 4 is a detailed view of the reinitialize delay logic.

FIG. 4 illustrates in detail, a preferred embodiment of the resettable maximum delay unit 300. The unit has a first and second input and an output. The unit comprises an interval timer and a second circuit. The interval timer comprises inverters 408 and 410. The second circuit comprises inverter 400, AND gate 402, NMOS transistor 404 and capacitor 406.

The first input of the resettable maximum delay unit 300 is the ATs input which is coupled to the first of the two inputs of AND gate 402. The second input, the DDs input, is coupled in parallel to the input of inverter 400 and the gate of NMOS transistor 404. The output of inverter 400 is coupled to the second of the two inputs of AND gate 402. The AND gate output is coupled to the input of inverter 408 and also to the drain side of NMOS transistor 404 and capacitor 406. The source side of NMOS transistor 404 and capacitor is coupled to ground. The output of inverter 408 is connected to the input of inverter 410. The output of inverter 410 is connected to the second input of first circuit 102.

In operation, the output of the AND gate 402 will be a logic 1 only when no change or pulse is present on DDs and when ATs is in a second state, corresponding in this embodiment to a set condition and a memory precharge. This condition will correspond to the instance in which a pulse has been received by first circuit 102 thereby placing the output in a second state or set condition. Immediately after the pulse and during the extended maximum delay period a logic 1 will be output by AND gate 402.

The logic 1 condition of AND gate 402 will cause charge to be placed on capacitor 406. When the charge on capacitor 406 is greater than the threshold voltage of inverter 408, the inverter 408 will transition from a logic 1 output to a logic 0. When this transition has taken place inverter 410 connected to the output of inverter 408 will transition from a logic 0 output to a logic 1. The output RRs of inverter 410 is communicated to the second input, in this embodiment the reset input, of the first circuit 102. When a logic 1 condition is present on RRs, the first circuit will reset and the ATs will return to the first state, in this embodiment the reset state.

The operation of the reinitialize feature of the current invention involves the cooperative operation of inverter 400, AND gate 402, NMOS transistor 404 and capacitor 406. Given an initial input condition which produces a logic 1 output from AND gate 402, a finite amount of time is required before the output of inverter 408 will flip from a from a logic 1 to a logic 0. The reason for the disparity in state between the output of AND gate 402 and the input of inverter 408 is explained by the presence of capacitor 406. When AND gate 402 transitions to a logic 1 condition a finite amount of current is output from that AND gate and the inverter 408 input will not immediately transition to a logic 1 condition. The input of inverter 408 will only be placed in a logic 1 condition when enough charge has been built up on capacitor 406 to elevate the voltage on the inverter to a threshold condition corresponding to a logic 1. If during the charging of capacitor 406 a change signal, in this embodiment a pulse, is output by difference detector 108 then that pulse on the gate of NMOS transistor 404 will cause that transistor to short capacitor 406 to ground. All charge will be removed from the capacitor and the voltage on the input of inverter 408 will return to logic 0. At the termination of the change signal or pulse, when the NMOS transistor 404 returns to the open condition the capacitor will resume charging from its reinitialized state if the output of AND gate 402 is a logic 1. When the voltage on the capacitor exceeds the threshold voltage, inverter 408 will transition to a logic 1 condition at its input. The time associated with this transition is the time constant associated with the charging of capacitor 406. When the voltage on the input of the inverter exceeds the threshold a finite time interval is required for the inverter 408 to transition its output. After the output of inverter 408 changes, a further finite time interval is required to transition the output of inverter 410. After the further finite time interval an RRs signal is generated on the output of inverter 410. In this embodiment that signal corresponds to a logic 1. When that signal is received at the second input of the first circuit 102 the output will transition to a first state. The first state, in this embodiment corresponds to the reset condition.

It should be remarked that the timed interval imposed by maximum resettable delay unit 300 is not solely a function of the time constant associated with the charging of capacitor 406. As is well known to those skilled in the art, an additional delay of approximately 1 ns is added by each gate, in this case inverters 400, 408, 410 and AND gate 402.

As will be apparent to one skilled in the art there are numerous logic arrangements which will product the results discussed above in connection with FIG. 4. For example, the transistor capacitor pair could be implemented as a pull-up rather than a pull-down arrangement.

Alternately, instead of an RC based delay, the delay and reinitialize feature could be achieved by numerous analog and digital devices. Digital realization of the teachings of this invention, could include a count down or count up timer that could be reinitialized.

As will also be apparent to those skilled in the art, the resettable maximum delay unit 300 need only receive the feed-forward signal DDs in order to achieve the results described above.

Figure 5:
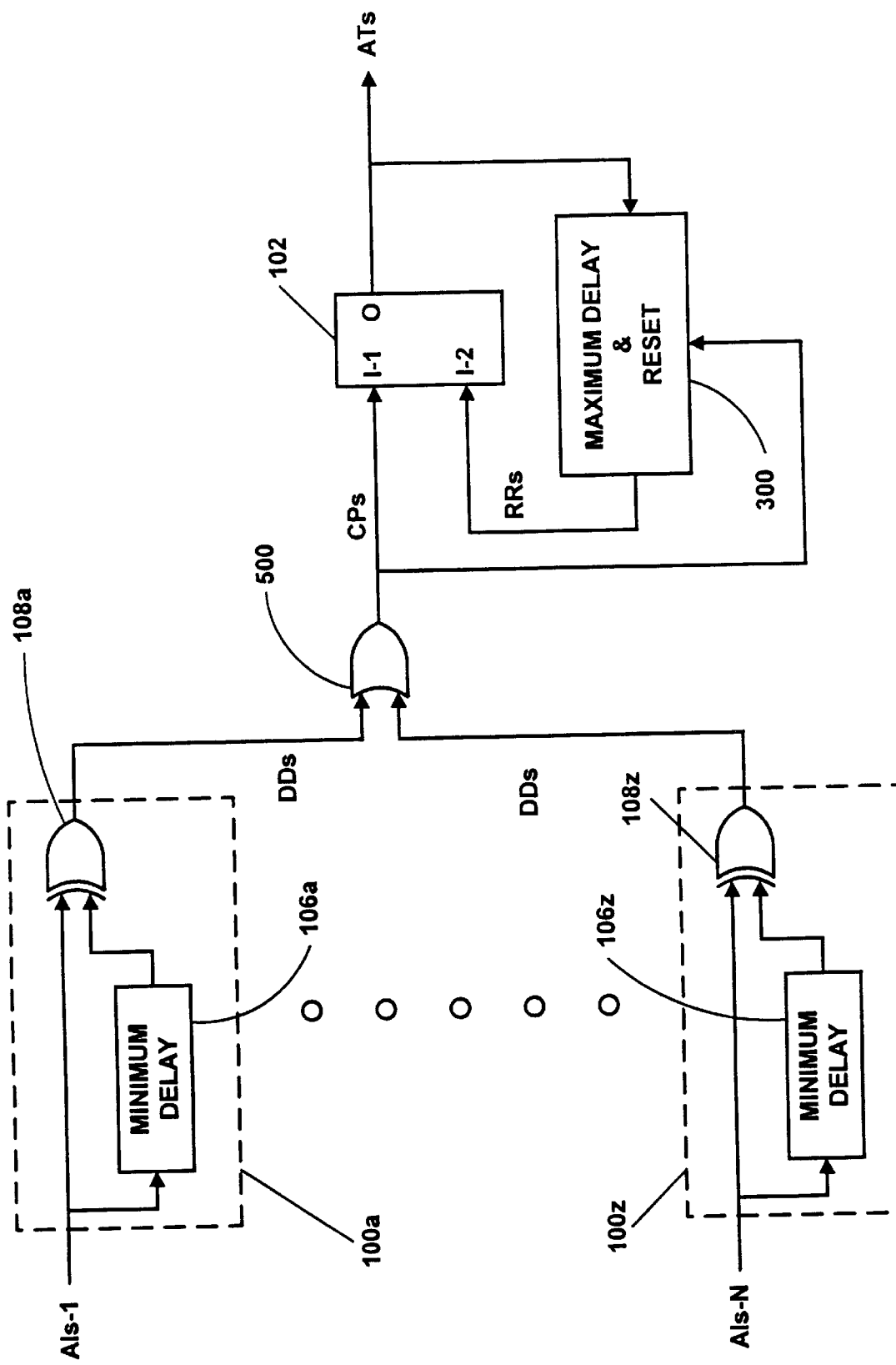
FIG. 5 is an address transition detection circuit for 'N' address.

In an alternate preferred embodiment of the invention as illustrated in FIG. 5, an ATD circuit suitable for an 'N' address system is disclosed. A plurality of edge detect units of which 100A and 100Z are referenced, are shown connected to individual address of an address bus having 'N' addresses of which AIs-1 and AIs-N are referenced. The input of edge detect unit 100A, and specifically minimum delay unit 106A and difference detector 108A are both connected to AIs-1. The output of minimum delay unit 106A is connected to the second input of difference detector 108A. The input of edge detect unit 100z, and specifically minimum delay unit 106Z and difference detector 108Z are both connected to AIs-N. The output of minimum delay unit 106Z is connected to the second input of difference detector 108Z. The output of each edge detect unit, including the referenced difference detectors 108A and 108Z, is connected to a respective input of OR gate 500. The output of the OR gate is connected to both the first input of first circuit 102 and the second of two inputs of the resettable maximum delay unit 300. The output of the first circuit is connected to the first of the two inputs of resettable maximum delay unit 300. The output of maximum resettable delay unit 300 is connected to the second input of the first circuit.

In operation an address signal from AIs-1 is received by both minimum delay unit 106A and difference detector 108A of edge detect unit 100A. As discussed in FIG. 3, difference detector 108A receives the address signal both directly from AIs-1 and indirectly via the output of minimum delay 106A, and responsive to these inputs, outputs a DDs. The DDs has pulses corresponding to either one or both of a rising/falling edge of the address signal. Each of the address lines and edge detect units, including the referenced edge detect unit 100z, operates in a similar manner. The outputs are combined by OR gate 500. The output of OR gate 500 is a series of combined pulses corresponding to changes on all of the address lines of the address bus. The CPs (combined pulse signal) is received at the first input, in this embodiment the set input, of first circuit 102 and also by the reset input of resettable maximum delay unit 300. The first circuit and maximum resettable delay unit 300 operate in the manner discussed above in connection with FIGS. 3 and 4 to produce an ATs at the output of first circuit. The circuit initiates a second state, in this embodiment a set condition on ATs, on the occurrence of a CPs. If the CPs are narrowly spaced in time, in relation to the timed interval of maximum resettable delay 300, the set state will be maintained until all addresses on an address bus have settled. The ATs produced by this address transition detection circuit, may therefore serve as the input of a state machine for controlling memory, or a decoder for a row or column of memory, or a buffer for moving data to and from memory.

Figure 6:
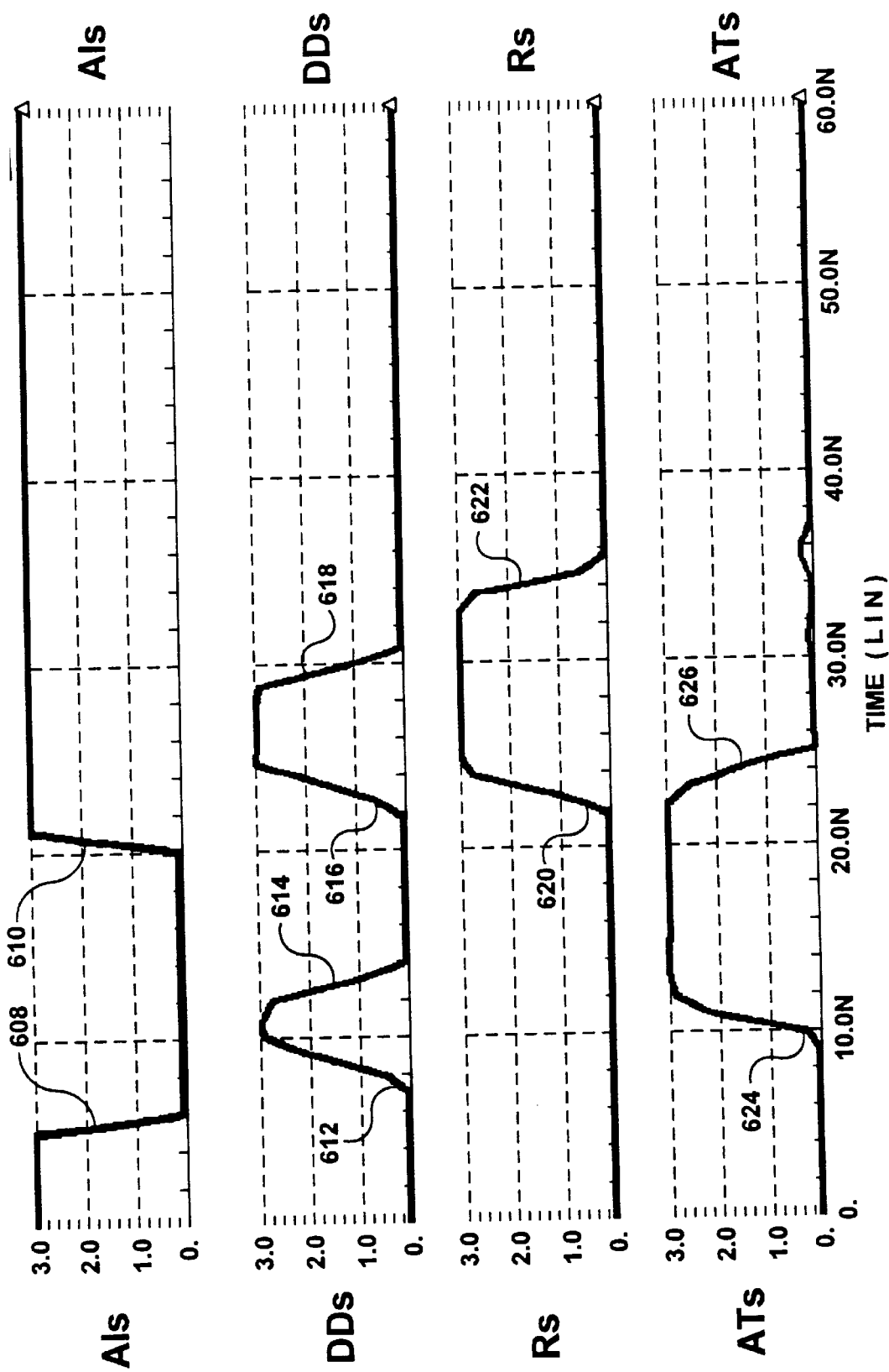
FIG. 6 illustrates the waveforms of the Prior Art unit shown in FIG. 1.

FIG. 6 illustrates the wave forms of the Prior Art ATD circuit shown in FIG. 1. The example in FIG. 6 exhibits a condition in which the shortcomings of the Prior Art ATD circuits is exhibited. Specifically, two closely spaced address changes are shown and the second of those changes is not processed properly. This will cause any circuit to which that Prior Art device is connected to be prone to a loss of memory or a delay in a memory access. Four wave forms are shown in FIG. 6 over a time interval of 60 nano seconds. The first wave form is the AIs input to edge detect unit 100 shown in FIG. 1. The second wave form is the DDs output by the difference detector 108. The third wave form is the Rs output by maximum delay unit 104. The fourth wave form is the ATs output by the first circuit 102.

AIs is shown with a falling edge 608 and a rising edge 610. Responsive to the falling edge 608 a first pulse is shown in DDs. Responsive to the rising edge 610 a second pulse is shown in DDs. The first pulse in DDs has a rising edge 612 and a falling edge 614. The second pulse has a rising edge 616 and a falling edge 618. The rising edge 612 of the first pulse of DDs is received at the first input of first circuit 102 as shown in FIG. 1. In response to a change signal or pulse on the first input of the first circuit the output transitions from a first to a second state, evidenced by the rising edge 624 on ATs. At the point when the rising edge 616 of the second pulse is received at the first input of the first circuit, the second input that circuit is already in receipt of a rising edge 620. This corresponds to a reset command on Rs. Under these conditions shown in Table 1 is set at logic 0 and reset at logic 1, the ATs is not maintained in a set condition, rather a falling edge 626 of ATs is exhibited immediately after the onset of the rising edge 620 of Rs. By the time Rs transitions back to a logic 0 at falling edge 622, the second pulse on DDs has is no longer exhibited, i.e., it has experienced a falling edge 618. As a result the second address rising edge 610 and the corresponding second pulse are not detected. Therefore, ATs will only be held in a second state for the timed interval following the first pulse but not the second. Even if the second pulse followed the first pulse more closely in time, it would not be operated on. There would be no extension of the period of time that ATs was held in the second state, or set condition, because the Prior Art maximum delay unit 104 as shown in FIG. 1 is only responsive to ATs and not to DDs.

Figure 7:
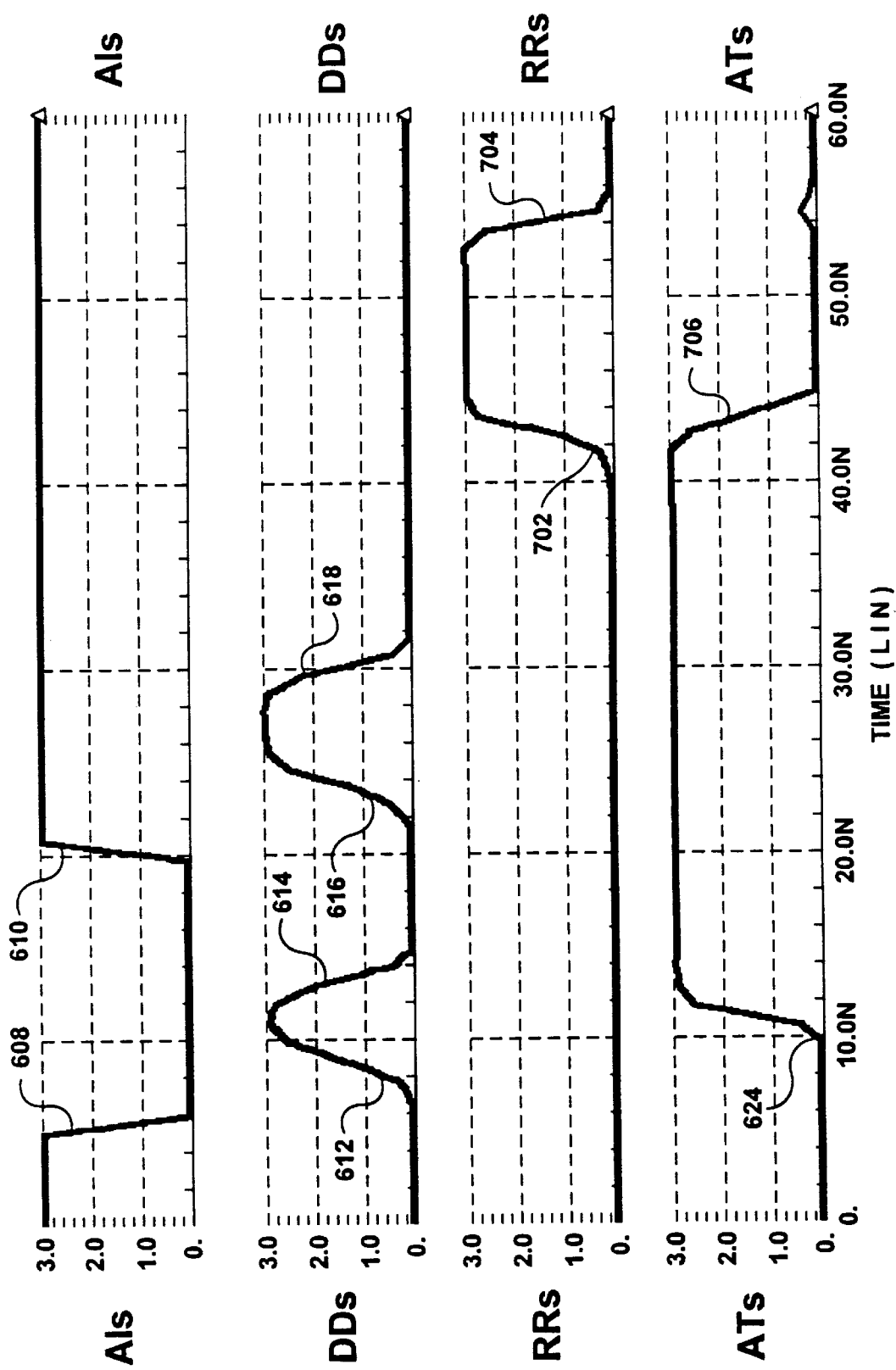
FIG. 7 illustrates the waveforms of FIG. 3.

FIG. 7 shows the wave forms associated with the current invention as illustrated in FIG. 3. Four wave forms are shown over the 60 nano second interval discussed above in FIG. 6. The first two wave forms: AIs and DDs, are identical to those shown and discussed above in FIG. 6. They correspond respectively, to the AIs input to the edge detect unit 100 and the output of difference detector 108 as shown in FIG. 3. AIs has a falling edge 608 and a rising edge 610. DDs has a first and a second pulse responsive respectively to the falling edge 608 and the rising edge 610 of AIs. The first pulse has a rising edge 612 and a falling edge 614 and the second pulse has a rising edge 616 and a falling edge 618.

The third and fourth wave forms are distinctly different, however, then those shown in FIG. 6. The fourth wave form, the ATs, corresponds to the output of the first circuit 102. The ATs exhibits a rising edge 624 at the same time as the rising edge shown on the ATs in FIG. 6. Significantly, however, a falling edge 706 of that wave form does not occur until approximately 20 nano seconds after the falling edge discussed above in connection with the ATs shown in FIG. 6. The falling edge 706 is responsive to a rising edge 702 in the third waveform, the RRs. The RRs corresponds to the output of the maximum resettable delay unit 300 shown in FIGS. 3–4. Significantly, the rising edge 702 of RRs does not occur until 20 nano seconds after the rising edge discussed above in connection with Rs in FIG. 6. The extended time interval before the rising edge 702, is a result of the reinitialization feature of the invention. When a falling edge 704 on RRs finally occurs, there is no change in ATs because DDs has remained low.

Accordingly, the present invention provides a new address detection circuit which achieves a number of advantages over the Prior Art. In particular, each and every address transition is accorded a corresponding delay interval. Additionally, the output of ATs is maintained in a second state, corresponding to a set condition, even while the circuitry is being reinitialized by the receipt of a second pulse. Furthermore, a very compact arrangement has been disclosed for detecting address transitions on a plurality of address lines of an address bus.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A signal transition detection circuit in an integrated circuit memory, comprising:

a first circuit comprising a first input, a second input and an output, responsive to a change signal on said first input to transition said output from a first to a second state, and responsive to a reset command on said second input to transition said output from said second state to said first state;

an interval timer comprising an output coupled to said second input of said first circuit and an input, and said interval timer responsive to an initialize command at said input to initiate a timed interval and after the expiration of said timed interval to generate said reset command at said output of said interval timer; and a second circuit comprising an input and an output, said output of said second circuit coupled to said input of said interval timer, responsive to said change signal on said input of said second circuit to generate said initialize command at said output of said second circuit and wherein said second circuit includes logic responsive to said output state of said first circuit and said change signal to generate said initialize command at said output of said second circuit.

2. The signal transition detection circuit of claim 1, further comprising:

an edge detection circuit comprising an input and an output, and said output of said edge detection circuit coupled to both of said first input of said first circuit and said input of said second circuit, and said input of said edge detection circuit responsive to an input signal transition to generate said change signal.

3. The signal transition detection circuit of claim 2, wherein:

said input signal transition is at least one of a rising signal edge and a falling signal edge of an address.

4. The signal transition detection circuit of claim 1, wherein said interval timer comprises:

an inverter comprising an input and an output, said inverter output coupled to said output of said interval timer and said inverter input responsive to said initialize command to generate said reset command at said inverter output after termination of said timed interval; and wherein said timed interval is a delay associated with said inverter transitioning said inverter output from an initial condition to generate said reset command in response to said initialize command.

5. The signal transition detection circuit of claim 1, wherein said interval timer comprises:

at least two inverters connected in series and comprising an input of a first inverter and an output of a last inverter, said output of said last inverter coupled to said output of said interval timer and said input of said first inverter responsive to said initialize command to generate said reset command at said output of said last inverter after termination of said timed interval; and wherein said timed interval is a delay associated with said at least two inverters transitioning said output of said last inverter from an initial condition to generate said reset command in response to said initialize command.

6. The signal transition detection circuit of claim 5, wherein said logic, comprises:

a capacitor comprising a first side connected to said input of said at least two inverters and a second side connected to a ground potential;

a first switch responsive to said change signal to short said first side of said capacitor to the ground potential; and a logic gate responsive to a logic combination corresponding to a, (said second state) AND (NOT (said change signal)), to apply sufficient charge to said capacitor first side to cause said capacitor to generate said initialize command.

7. The signal transition detection circuit of claim 6, further comprising:

an edge detection circuit comprising an input and an output, and said output of said edge detection circuit coupled to both said first input of said first circuit and said input of said second circuit, and said input of said edge detection circuit responsive to an input signal transition to generate said change signal.

8. The signal transition detection circuit of claim 7, wherein:

said input signal transition is at least one of a rising edge of an address transition and a falling edge of an address transition.

9. An address transition detection circuit to detect changes in a plurality of lines of an address bus, in an integrated circuit memory comprising:

a combiner comprising a plurality of inputs and an output, responsive to change signals on said plurality of inputs to generate a combined change signal at said output;

a first circuit comprising a first input, a second input and an output, said first input coupled to said output of said combiner and responsive to said combined change signal on said first input to transition said output from a first to a second state, and responsive to a reset command on said second input to transition said output from said second state to said first state;

an interval timer comprising an output coupled to said second input of said first circuit and an input, said interval timer responsive to an initialize command on said input to initiate a timed interval and after the expiration of said timed interval to generate said reset command at said output of said interval timer; and a second circuit comprising an input and an output, said output of said second circuit coupled to said input of said interval timer, and said input of said second circuit coupled to said output of said combiner and responsive to said combined change signal on said input of said second circuit to generate said initialize command at said output of said second circuit, and wherein said second circuit includes:

logic responsive to said output state of said first circuit and said combined change signal to generate said initialize command at said output of said second circuit.

10. The address transition detection circuit of claim 9, further comprising:

a plurality of edge detection circuits each comprising an input and an output, and each input connected to a separate one of said address lines, and said output of each of said plurality of edge detection circuits coupled to a separate one of said plurality of inputs of said combiner, and said input of each of said plurality of edge detection circuits responsive to an address signal transition to generate a one of said change signals.

11. The address transition detection circuit of claim 10, wherein:

said address signal transition is at least one of a rising signal edge and a falling signal edge.

12. The address transition detection circuit of claim 9, wherein said interval timer comprises:

an inverter comprising an input and an output, said inverter output coupled to said output of said interval timer and said inverter input responsive to said initialize command to generate said reset command at said inverter output after termination of said timed interval; and wherein said timed interval is a delay associated with said inverter transitioning said inverter output from an initial condition to generate said reset command in response to said initialize command.

13. The address transition detection circuit of claim 9, wherein said interval timer comprises:

at least two inverters connected in series and comprising an input of a first inverter and an output of a last inverter, said output of said last inverter coupled to said output of said interval timer and said input of said first inverter responsive to said initialize command to generate said reset command at said output of said last inverter after termination of said timed interval; and wherein said timed interval is a delay associated with said at least two inverters transitioning said output of said last inverter from an initial condition to generate said reset command in response to said initialize command.

14. The address transition detection circuit of claim 12, wherein said logic comprises:

a capacitor comprising a first side connected to said input of said first of said at least two inverters and a second side connected to a ground potential;

a first switch responsive to said combined change signal to short said first side of said capacitor to the ground potential; and a logic gate responsive to a logic combination corresponding to a, (said second state) AND (NOT (said combined change signal)), to apply sufficient charge to said capacitor to cause said capacitor to generate said initialize command.

15. The address transition detection circuit of claim 14, further comprising:

a plurality of edge detection circuits each comprising an input and an output, and each input connected to a separate one of said plurality of lines of an address bus, and said output of each of said plurality of edge detection circuits coupled to a separate one of said plurality of inputs of said combiner, and said input of each of said plurality of edge detection circuits responsive to an address signal transition to generate a one of said change signals.

16. The address transition detection circuit of claim 15, wherein:

said address signal transition is at least one of a rising signal edge and a falling signal edge.

17. An integrated circuit memory having a plurality of input pins, comprising:

a plurality of edge detection circuits having an input and an output, and each input connected to a separate one of said plurality of input pins, and each of said plurality of edge detection circuits responsive to an address signal transition on said separate one of said input pins to generate a change signal on said output;

a combiner comprising a plurality of inputs and an output, and each of said plurality of inputs coupled to a separate one of said outputs of said plurality of edge detection circuits and responsive to said change signals on said plurality of inputs to generate a combined change signal at said output;

a first circuit comprising a first input, a second input and an output, said first input coupled to said output of said combiner and responsive to said combined change signal on said first input to transition said output from a first to a second state, and responsive to a reset command on said second input to transition said output from said second state to said first state;

an interval timer comprising an output coupled to said second input of said first circuit and an input, said interval timer responsive to an initialize command on said input to initiate a timed interval and after the expiration of said timed interval to generate said reset command at said output;

a second circuit comprising an input and an output, said output of said second circuit coupled to said input of said interval timer, and said input of said second circuit coupled to said output of said combiner and responsive to said combined change signal on said input to generate said initialize command at said output, and wherein said second circuit includes; a logic responsive to said output state of said first circuit and said combined change signal to generate said initialize command at said output of said second circuit, and;

a memory control logic having an input and an output, said input coupled to said output of said first circuit and said output coupled to the memory, and responsive to said output state of said first circuit on said input to generate a memory control signal.

18. The integrated circuit memory of claim 17, wherein said interval timer comprises:

at least two inverters connected in series and comprising an input of a first inverter and an output of a last inverter, said output of said last inverter coupled to said output of said interval timer and responsive to said initialize command at said input of said first inverter to generate said reset command at said output of said last inverter after termination of said timed interval; and wherein said timed interval is a delay associated with said at least two inverters transitioning said output of said last inverter from an initial condition to generate a reset command in response to said initialize command.

19. The integrated circuit memory of claim 18, wherein said logic comprises;

a capacitor comprising a first side connected to said input of said first of said at least two inverters and a second side connected to a ground potential;

a first switch responsive to said combined change signal to short said first side of said capacitor to the ground potential; and a logic gate responsive to a logic combination corresponding to a, (said second state) AND (NOT (said combined change signal)), to apply sufficient charge to said capacitor to cause said capacitor to generate said initialize command.

* * * * *